United States Patent [19]

Michael

[11] Patent Number: 4,673,869
[45] Date of Patent: Jun. 16, 1987

[54] DIELECTRIC CONSTANT DETECTOR CAPACITANCE MATCHING

[75] Inventor: Richard W. Michael, Pasadena, Tex.

[73] Assignee: Phillips Petroleum Company, Bartlesville, Okla.

[21] Appl. No.: 701,338

[22] Filed: Feb. 13, 1985

[51] Int. Cl.[4] ............................................. G01R 27/26
[52] U.S. Cl. ................................. 324/61 R; 324/60 C
[58] Field of Search ........................... 324/61 R, 60 C; 73/61 R, 61.1 R, 61.1 C

[56] References Cited

U.S. PATENT DOCUMENTS 3,862,571  1/1975  Vogel ........................... 324/60 C X
4,301,401  11/1981 Roof et al. ......................... 324/61 R Primary Examiner—Stanley T. Krawczewicz
Attorney, Agent, or Firm—George E. Bogatie

[57] ABSTRACT

A circuit is provided whereby varactor diode is placed in parallel with a capacitance of either the sample or reference cell of a dielectric constant detector. At least the circuitry for applying a voltage to the varactor diode is located outside of the oven in which a dielectric constant detector would typically be located. When the same fluid is flowing through both the sample cell and reference cell, the voltage applies to the varactor diode is manipulated until such time as the capacitance of the sample cell and reference cell are substantially matched as seen by the circuitry which processes the output signals from the dielectric constant detector.

20 Claims, 3 Drawing Figures

DIELECTRIC CONSTANT DETECTOR CAPACITANCE MATCHING

This invention relates to a circuit for substantially matching the capacitance of the sample and reference cells of a dielectric constant detector.

U.S. Pat. No. 4,301,401 discloses a dielectric constant detector in which mechanical means is provided for substantially matching the capacitance of the sample cell and the capacitance of the reference cell when the same fluid is flowing through both the sample cell and reference cell. However, while the dielectric constant detector illustrated in U.S. Pat. No. 4,301,401 provided a substantial advance in such detectors, it has been found that fine tuning of the capacitance match between the sample and reference cells is difficult because the dielectric constant detector is generally located in the oven associated with a chromatographic analyzer system. Temperature stability problems are caused when the oven is opened to adjust the capacitance of the dielectric constant detector described in U.S. Pat. No. 4,301,401.

It is thus an object of this invention to provide a circuit which can be utilized to substantially match the capacitance of the sample and reference cells of a dielectric constant detector from a location outside of the oven such that temperature stability is not impaired.

In accordance with the present invention, a circuit is provided whereby a varactor diode is placed in parallel with the capacitance of either the sample or reference cell of a dielectric constant detector. At least the circuitry for applying a voltage to the varactor diode is located outside of the oven in which a dielectric constant detector would typically be located. When the same fluid is flowing through both the sample cell and reference cell, the voltage applied to the varactor diode is manipulated until such time as the capacitance of the sample cell and reference cell are substantially matched as seen by the circuitry which processes the output signals from the dielectric constant detector. Thus, a remote method is provided for substantially matching the capacitance of the sample and reference cells of a dielectric constant detector without opening an oven door.

Other objects and advantages of the invention will be apparent from the foregoing brief description of the invention and the appended claims as well as from the detailed description of the drawings in which:

The present invention is described in terms of a dielectric constant detector utilized in liquid chromatography. However, dielectric contstant detectors may be used in applications other than liquid chromatography and the present invention would also be useful in such applications.

The present invention is also described in terms of the dielectric constant detector being located inside an oven. However, the present invention may be used in any application where it is desired to balance the capacitance of the sample and reference cells of the dielectric constant detector without actually handling the dielectric constant detector.

The invention is also described in terms of the dielectric constant detector illustrated in U.S. Pat. No. 4,301,401. However, the invention is applicable to other dielectric constant detectors where it is desired to match the capacitance of the reference cell and sample cell.

Figure 1:
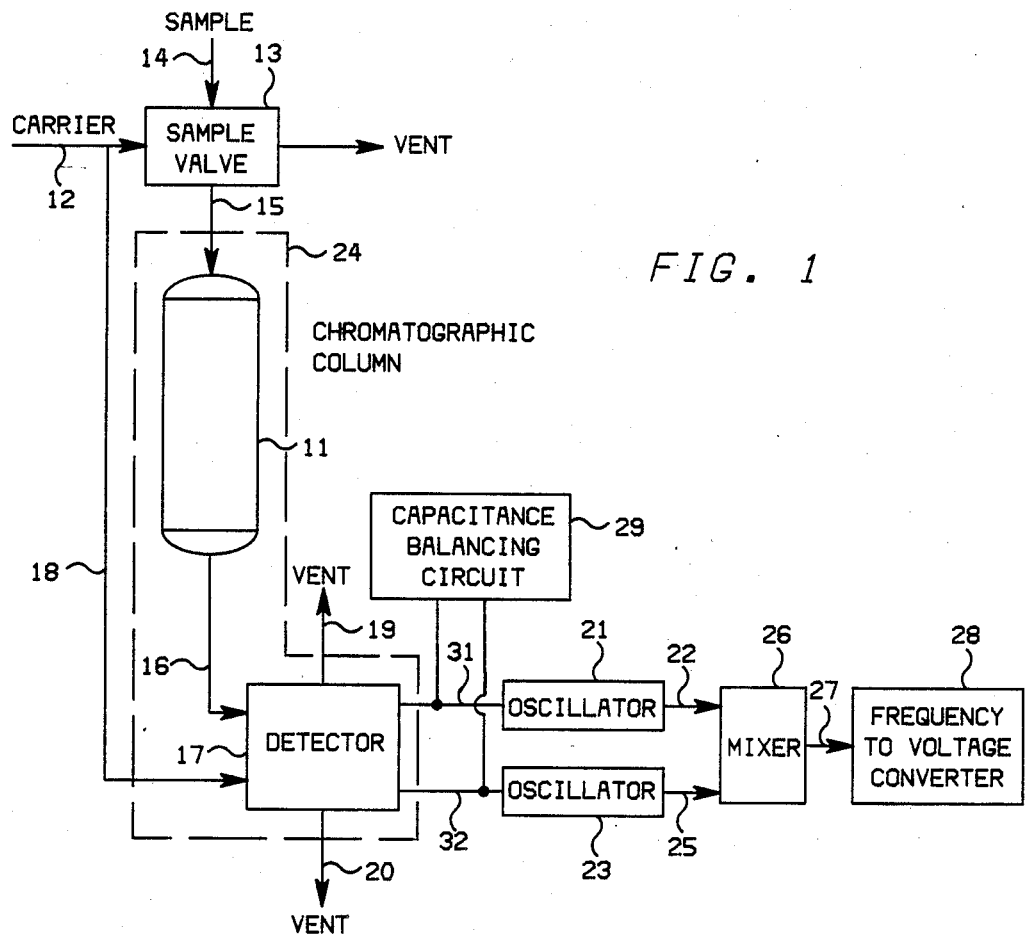
FIG. 1 is a representation of a chromatographic analyzer system employing a dielectric constant detector and the capacitance balancing circuit of the present invention.

Referring now to the drawings and in particular to FIG. 1, there is illustrated a chromatographic column 11. A sample of a fluid to be analyzed is delivered to sample valve 13 through conduit 14. Conduit 15 extends between sample valve 13 and the chromatographic column 11. Conduit 16 extends between the outlet of chromatographic column 11 and the sample inlet of the dielectric constant detector 17. Carrier fluid is passed through the reference portion of the dielectric constant detector 17 by being introduced into the reference inlet of the dielectric constant detector 17 through conduit 18 which is in fluid communication with conduit 12. Carrier fluid flows through sample valve 13 and chromatographic column 11 to the sample inlet of the dielectric constant detector 17.

The chromatographic column 11 and the detector 17 are illustrated as being contained in a chromatographic over 24. It is noted that, in some cases, the sample valve 13 would also be located in the oven 24. Also, in some cases, some of the circuitry described hereinafter may be located in the oven 24. However, the important consideration from the standpoint of the present invention is that the detector 17 is located in the oven 24 and the capacitance balancing circuit 29, which will be described hereinafter, is not located in the oven 24.

At the beginning of an analysis period, sample valve 13 is actuated to introduce a predetermined volume of sample into the carrier fluid flowing through chromatographic column 11. The constituents of the sample are eluted in sequence and flow from the chromatographic column 11 through conduit 16 to the sample cell of the dielectric constant detector 17. An electrical conductor 31 electrically connects one plate of the sample cell to the oscillator 21. An electrical conductor 32 electrically connects one plate of the reference cell to the oscillator 23. The sample cell of the dielectric constant detector 17 in conjunction with the oscillator 21 establishes an output signal 22 which has a frequency which corresponds to the capacitance of the sample cell when a particular constituent of the sample is passing through the sample cell. In like manner, the reference cell of the dielectric constant detector 17 in conjunction with the oscillator 23 provides an output signal 25 which has a frequency which is a function of the capacitance of the reference cell when only carrier fluid is passing through the reference cell. Signal 22 is provided from the oscillator 21 as an input signal to the mixer 26. Signal 25 is provided from the oscillator 23 as an input to the mixer 26. Signals 22 and 25 are combined in the mixer 26 to provide signal 27 which is representative of the difference between the frequencies of signals 22 and 25. Signal 27 is provided from the mixer 26 as an input to the freuqency-to-voltage converter 28. Signal 27 is converted from an oscillating signal to a DC voltage by frequency-to-voltage converter 28 and the DC voltage will be representative of the concentration of the particular component passing through the sample cell.

Prior to performing an analysis, the capacitance of the reference cell and sample cell of the dielectric constant detector 17 are first matched to the extent possible when carrier fluid is flowing through both the sample and reference cells according to the mechanical procedures set forth in U.S. Pat. No. 4,301,401 which will be described hereinafter. The oven door is then closed and the system is allowed to achieve temperature stability. The capacitance balancing circuit 29 is then utilized to more accurately substantially balance the capacitance of the sample cell and the reference cell when carrier fluid is flowing through both with respect to the electronics represented by oscillators 21 and 23, mixer 26 and freuqency converter 28. Thus, the electronics will see the capacitance of the sample cell and reference cell as being substantially matched even though a part of this matching is being provided by the capacitance balancing circuit 29.

Figure 2:
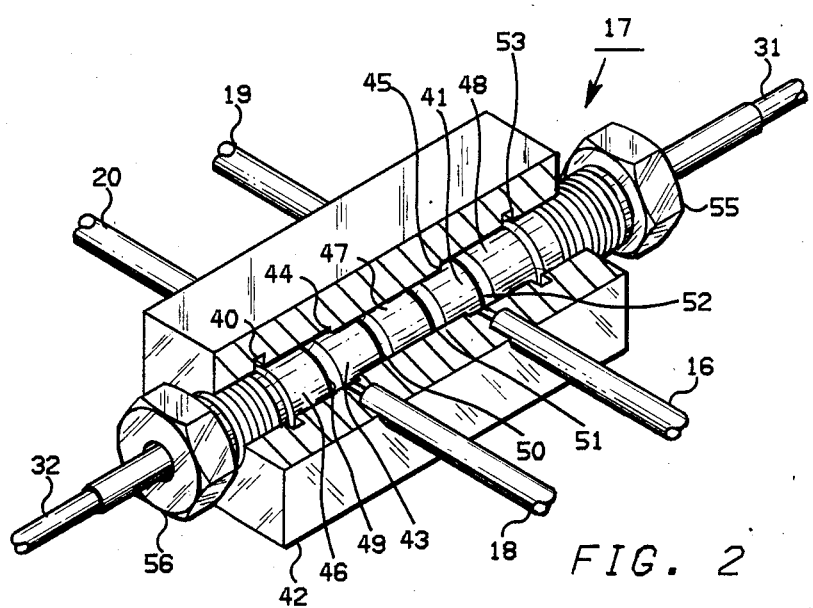
FIG. 2 is a detailed illustration of the dielectric constant detector illustrated in FIG. 1.

The dielectric constant detector 17 is more fully illustrated in FIG. 2. Referring now to FIG. 2, the sample cell of the dielectric constant detector 17 is formed by the center plate 41 and the outer plate 42. The reference cell is formed by the center plate 43 and the outer plate 42. All of the plates are preferably formed from stainless steel. The outer plate 42, which is common to both the sample cell and the reference cell, is preferably machined in the form of a prism having a substantially square transverse cross section. An opening extends for the length of the prism. The opening extending through the center portion of the prism forms first, second and third serially contiguously connected cylindrical openings. The first cylindrical opening extends from the edge of the groove 40 which is adjacent the spacer 46 to a circular line 44 which lies in a plane which is at least substantially perpendicular to the longitudinal axis of the opening, the plane extending through the longitudinal midregion of center plate 43. In the illustrated embodiment line 44 is formed by an annular shoulder. The second cylindrical opening extends from the line 44 to a circular line 45 which lies in a plane which is at least substantially perpendicular to the longitudinal axis of the opening, the plane extending through the longitudinal midregion of center plate 41. In the illustrated embodiment line 43 is formed by an annular shoulder. The third cylindrical opening extends from the line 45 to the edge of the groove 53 which is adjacent the spacer 48. The diameter of the first and third cylindrical openings are preferably equal. The diameter of the second cylindrical opening is less than the diameter of the first and third cylindrical openings. The center plates 41 and 43 do not touch the outer plate 42 at any point. The center plates 41 and 43 are cylindrical in form and are electrically isolated by the spacers 46, 47 and 48 which are preferably formed from KEL-F ® manufactured by Union Carbide. The O-rings 49–52, which are preferably Teflon ®, provide means for sealing the sample and reference cells to prevent leakage of fluid out of the sample and reference cells. The O-rings 49–52 also provide means for centering the center plates 41 and 43 with respect to the outer plate 42. The entire assembly consisting of the center plates 41 and 43, the spacers 46, 47 and 48 and the O-rings 49–52 is held in place by the end caps 55 and 56 which are coupled by means of threads to the outer plate 42. The end caps 55 and 56 also provide a means for longitudinally moving the center plates 41 and 43 with respect to the outer plate 42.

The electrical conductor 32 is electrically connected to the center plate 43 and is electrically isolated from the outer plate 42. The electrical conductor 31 is electrically connected to the center plate 41 and is electrically isolated from the outer plate 42. The outer plate 42 is electrically connected to ground.

The outer plate 42 and the center plate 41 from concentric cylindrical plates. Solute plus carrier is provided from the chromatographic column 11 through conduit 16 to the space between the concentric cylindrical plates. All conduits are preferably 1/16 inch outside diameter × 0.010 inch inside diameter stainless steel tubing. The volume of the fluid which may be contained in the sample cell is determined by the position of the center plate 41 with respect to the outer plate 42. As has been previously noted, the second cylindrical opening in the outer plate 42, which extends into the sample cell, has a smaller diameter than the first cylindrical opening in the outer plate 42 which also extends into the sample cell. Longitudinal movement of the center plate 41 with respect to the outer plate 42 will thus change the volume of fluid which can be contained in the sample cell. The volume of fluid contained in the sample cell determines the capacitance of the sample cell and in this manner, the capacitance of the sample cell can be adjusted.

In like manner, carrier fluid is provided through conduit 18 to the reference cell. The center plate 43 can be moved longitudinally along the common axis with respect to the outer plate 42 so as to adjust the capacitance of the reference cell in the same manner as previously described for the sample cell.

Movement of the center plate 41 and the center plate 43 is accomplished by simultaneously turning the end caps 55 and 56 in opposite directions. Preferably, for purposes of adjustment only, carrier fluid only is provided to both the sample cell and reference cell. The end caps 55 and 56 are then simultaneously turned so as to substantially match the capacitance of the sample cell and the capacitance of the reference cell when the same fluid is flowing through both cells.

Figure 3:
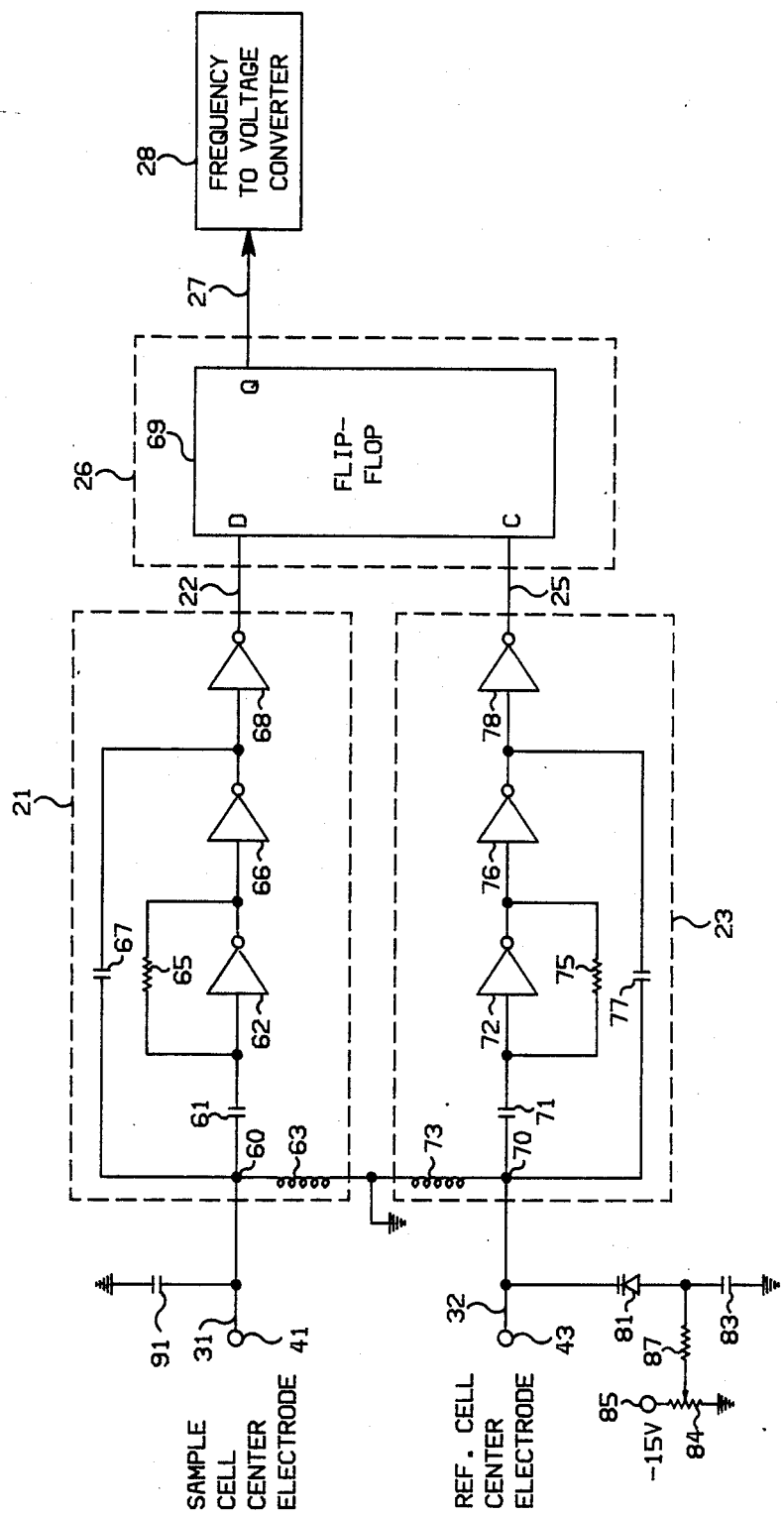
FIG. 3 is a schematic representation of the electrical circuitry illustrated in FIG. 1.

The capacitance balancing circuit 29, the oscillators 21 and 23, the mixer 26 and the frequency-to-voltage converter 28 illustrated in FIG. 1 are more fully illustrated in FIG. 3. Referring now to FIG. 3, the center plate 41 of the sample cell is electrically connected to node 60. The inductor 63 is electrically connected between node 60 and electrical ground. Node 60 and the input of the inverter 62 are electrically connected through the capacitor 61. The output of the inverter 62 is fed back to the input of the inverter 62 through resistor 65. The output of the inverter 62 is also electrically connected to the input of the inverter 66. The output of the inverter 66 is fed back to node 60 through capacitor 67. The output of the inverter 66 is also provided as an input to the inverter 68. The output of the inverter 68 forms signal 22 which has a frequency representative of the capacitance of the sample cell of the dielectric constant detector 17. Signal 22 is provided to the D input of the flip-flop 69 which forms the mixer 26 illustrated in FIG. 1.

The center plate 43 of the sample cell is electrically connected to node 70. The inductor 73 is electrically connected between node 70 and electrical ground. Node 70 and the input of the inverter 72 are electrically connected through the capacitor 71. The output of the inverter 72 is fed back to the input of the inverter 72 through resistor 75. The output of the inverter 72 is also electrically connected to the input of the inverter 76. The output of the inverter 76 is fed back to node 70 through capacitor 77. The output of the inverter 76 is also provided as an input to the inverter 78. The output of the inverter 78 forms signal 25 which has a frequency representative of the capacitance of the sample cell of the dielectric constant detector 17. Signal 25 is provided to the C input of the flip-flop 79 which forms the mixer 26 illustrated in FIG. 1.

The frequency of the output signal 22 from the sample oscillator 21 is determined primarily by the value of the inductor 63 and the capacitance of the sample cell of the dielectric constant detector 17. In like manner, the frequency of the output signal 25 from the reference oscillator 23 will be determined by the value of inductor 73 and the capacitance of the reference cell of the dielectric constant detector 17. The values of inductors 63 and 73 are preferably equal. Thus, the difference in the frequencies of signals 22 and 25 will be determined solely by the difference between the capacitance of the reference cell and the capacitance of the sample cell. The difference between the capacitance of the reference cell and the capacitance of the sample cell is determined by the dielectric constant of the component of the sample which together with the carrier fluid is flowing through the sample cell of the dielectric constant detector. Thus, the difference in the frequencies of signals 22 and 25 will be a function of the dielectric constant of the component of the sample which together with the carrier fluid is flowing through the sample cell of the dielectric constant detector.

The flip-flop 69 acts as a mixer. Thus, the Q output which is representative as signal 27 will be substantially equal to the difference in the frequencies of signals 22 and 25. Signal 27 is provided from the Q output of the flip-flop 69 to the frequency-to-voltage converter 28 which may be a Model 453J, K or L obtainable from Analog Device, Norwood, Mass. Signal 27 is converted from an AC signal to a DC voltage by the frequency-to-voltage converter 28 and the DC voltage will be proportional to the concentration of a component of the sample which is flowing through the sample cell of the dielectric constant detector 17.

As was stated above, the frequency of the output signal 22 from the sample oscillator 21 is determined primarily by the value of the inductor 63 and the capacitance of the sample cell of the dielectric constant detector 17. Also, the same is true for the frequency of the output signal 25 except that the inductor 73 is involved and also the capacitance of the reference cell. However, with the circuitry of the present invention, the capacitance of the sample cell and reference cell is given not only by the setting of the dielectric constant detector but also by the circuitry which will be described hereinafter which comprises the capacitance balancing circuit 29 illustrated in FIG. 1.

The varactor diode 81 is connected in parallel with the capacitance of the reference cell. A RF path to ground for the varactor diode 81 is provided by capacitor 83. A voltage is applied to the anode of the varactor 81 through the combination of potentiometer 84, one terminal which is connected to the −15 volt power supply 85, and the resistor 87.

The capacitor 91 is preferably connected in parallel with the capacitance of the sample cell. The value for capacitor 91 is such as to match the average capacitance which will be added by the varactor diode 81. However, as will be discussed hereinafter, capacitor 91 is not required.

The varactor diode 81 is preferably one which can have a capacitance in the range of about 10 pF to about 40 pF. Other capacitances can be utilized if desired but, since the capacitance of the reference and sample cells will be small, small capacitances are preferred for the varactor diode 81.

The particular varactor diode utilized was an IN 5145. This varactor diode has a capacitance which ranges from about 40 picofarads at 1 volt to about 15 picofarads at higher voltage.

Capacitor 83 is preferable a large capacitor on the order of at least 20 times the size of the average capacitance which will supplied by the varactor diode 81. Thus, a RF ground is provided without reducing the overall capacitance appreciably.

In operation, the capacitance of the sample cell and reference cell are matched to the extent possible by turning the end caps 55 and 56 illustrated in FIG. 2. The oven door is then closed and temperature stability is achieved. The capacitance with respect to the signal processing circuitry is then substantially matched when carrier fluid is flowing through both the sample cell and reference cell. This is accomplished by adjusting the setting of potentiometer 84 until the frequency of the output signal 22 is only slightly greater (about 10 KHz is preferred) than the frequency of the output signal 25. Again, this can be accomplished outside of the oven which is the particular advantage of the present invention.

Throughout the foregoing disclosure, the capacitance of the sample cell and reference cell have been referred to as being substantially matched. It has been found that, while the capacitance of the sample cell and reference cell should be very closely or substantially matched, they should not be exactly matched such that signals 22 and 25 have exactly the same frequency when carrier fluid is flowing through both the sample cell and reference cell. If this is done the signals have a tendency to synchronize or lock together. This has a tendency to create a dead band in that it taken a certain change in capacitance to pull the two frequencies apart. Thus, with the oscillators perfectly matched, a small peak can be lost altogether. Further, for a large peak, the output of the mixer will be a step function if the oscillators are perfectly matched. Thus, as used herein, the term substantially matched refers to the capacitances being very closely matched such that the frequencies of signals 21 and 25 are very close (preferably the difference is about 10 kilohertz) but are not exactly matched. It is noted that 10 kilohertz is a very small offset since the nominal frequencies of the oscillators is about 1.3 megahertz.

If desired, capacitor 91 may be deleted. However, this would generally require that the cells be adjusted such that the capacitance of the reference cell is 10-20 picofarads less than the capacitance of the sample cell by means of the end caps 55 and 56. This is generally not a preferred form of operation and thus the use of the balancing capacitor 91 is preferred.

Coaxial cable is preferably utilized to apply the voltage to the varactor diode 81. This prevents noise from interfering with the capacitance provided by the varactor diode 81.

Commercially available components plus the values for capacitors, inductors and resistors, which may be utilized in the circuit illustrated in FIG. 3 are as follows:

Inductors 63 and 73: 47 microhenries
Capacitors 61 and 71: 100 picofarads
Capacitors 67 and 77: 10 picofarads
Inverters 62, 66, 68, 72, 76 and 78: MC 14049, Motorola Semiconductor
Resistors 65 and 75: 100 Kohms Flip-flop 69: MC 14013, Motorola Semiconductor
Capacitor 91: 15 picofarads
Capacitor 83: 470 picofarads
Resistor 87: 1.47 Kohms
Potentiometer 84: 20 Kohms, Spectrol 534

The invention has been described in terms of a preferred embodiment as illustrated in FIGS. 1–3. As has been previously stated, many different chromatographic analyzer configurations and dielectric constant detectors could be utilized and also many different electrical circuits could be utilized. As an example, the varactor diode could be connected to the sample cell instead of the reference cell.

While the invention has been described in terms of the presently preferred embodiment, reasonable variations and modifications are possible by those skilled in the art. Such variations are within the scope of the described invention and the appended claims.

That which is claimed is:

1. Apparatus comprising:
    a dielectric constant detector having a reference cell and a sample cell, wherein said reference cell has first and second plates which form a first capacitor and wherein said sample cell has first and second plates which form a second capacitor;
    means for passing a fluid through said reference cell;
    means for passing a fluid through said sample cell;
    a varactor diode;
    means for electrically connecting the cathode of said varactor diode to said first plate of one of said first capacitor and said second capacitor;
    a third capacitor having a capacitance substantially larger than the capacitance which can be provided by said varactor diode;
    means for electrically connecting the anode of said varactor diode to ground through said third capacitor, wherein said third capacitor provides a low impedance path to ground for radio frequencies;
    means for electrically connecting said second plates of said first capacitor and said second capacitor to ground;
    means for supplying a voltage to the anode of said varactor diode, wherein said voltage is continuously adjustable for controlling the capacitance provided by said varactor diode; and
    means for varying the magnitude of the voltage supplied to the anode of said varactor diode.

2. Apparatus in accordance with claim 1 additionally comprising a fourth capacitor electrically connected to parallel to the one of said first capacitor or said second capacitor to which said varactor diode is not electrically connected, wherein said fourth capacitor has a capacitance substantially equal to the average capacitance added by said varactor diode to the one of said first capacitor or said second capacitor to which said varactor diode is electrically connected in parallel.

3. Apparatus in accordance with claim 2 wherein said varactor diode is electrically connected in parallel with said first capacitor and said fourth capacitor is electrically connected in parallel with said second capacitor, said apparatus additionally comprising:
    a first oscillator, wherein said second capacitor in parallel with said fourth capacitor forms a capacitance element of said first oscillator;
    a second oscillator, wherein said first capacitor in parallel with said varactor diode forms a capacitance element of said second oscillator; and
    means for combining the output signal from said first oscillator and the output signal from said second oscillator to establish a difference frequency signal, wherein the voltage applied to the anode of said varactor diode is manipulated until said difference frequency is about 10 KHz when the same fluid is present in said reference cell and said sample cell so as to substantially match the capacitance of said reference cell and said sample cell as seen by said first oscillator and said second oscillator when the same fluid is in said reference cell and said sample cell.

4. Apparatus in accordance with claim 2 wherein said varactor diode is electrically connected in parallel with said second capacitor and said fourth capacitor is electrically connected in parallel with said first capacitor, said apparatus additionally comprising:
    a first oscillator, wherein said second capacitor in parallel with said varactor diode forms a capacitance element of said first oscillator; and
    a second oscillator, wherein said first capacitor in parallel with said fourth capacitor forms a capacitance element of said second oscillator; and
    means for combining the output signal from said first oscillator and the output signal from said second oscillator to establish a difference frequency signal, wherein the voltage applied to the anode of said varactor diode is manipulated until said difference frequency is about 10 KHz when the same fluid is present in said reference cell and said sample cell so as to substantially match the capacitance of said reference cell and said sample cell as seen by said first oscillator and said second oscillator when the same fluid is in said reference cell and said sample cell.

5. Apparatus in accordance with claim 1 additionally comprising a chromatographic oven, wherein said dielectric constant detector is located inside of said chromatographic oven and said means for varying the magnitude of the voltage supplied to said varactor diode is located outside of said chromatographic oven.

6. Apparatus for obtaining an analysis of the concentration of a component of a material comprising:
    a chromatographic separation column;
    means for passing a stream of a carrier fluid to said chromatographic separation column;
    means for injecting a sample of said material into said stream of said carrier fluid flowing to said chromatographic separation column;
    a dielectric constant detector having a reference cell and a sample cell, wherein said reference cell has first and second plates which form a first capacitor and wherein said sample cell has first and second plates which form a second capacitor;
    a varactor diode;
    means for electrically connecting the cathode of said varactor diode to said first plate of one of said first capacitor and said second capacitor;
    a third capacitor having a capacitance substantially larger than the capacitance which can be provided by said varactor diode;
    means for electrically connecting the anode of said varactor diode to ground, wherein said third capacitor provides a low impedance path to ground for radio frequencies;
    means for electrically connecting said second plates of said first capacitor and said second capacitor to ground;

means for supplying a voltage to the anode of said varactor diode wherein said voltage is continuously adjustable for controlling the capacitance provided by said varactor diode;

means for varying the magnitude of the voltage supplied to the anode of said varactor diode in such manner that the capacitance of said sample cell is substantially matched to the capacitance of said reference cell when only said carrier fluid is flowing through both said reference cell and said sample cell;

means for passing the stream of said carrier fluid containing separated components of the sample of said material from said chromatographic separation column through said sample cell of said dielectric constant detector; and means for passing a stream of said carrier fluid through said reference cell of said dielectric constant detector, wherein the difference between the capacitance of said sample cell and the capacitance of said reference cell is representative of the concentration of a component of said sample passing through said sample cell.

7. Apparatus in accordance with claim 6 additionally comprising a fourth capacitor electrically connected in parallel to the one of said first capacitor or said second capacitor to which said varactor diode is not electrically connected, wherein said fourth capacitor has a capacitance substantially equal to the average capacitance added by said varactor diode to the one of said first capacitor or said second capacitor to which said varactor diode is electrically connected in parallel.

8. Apparatus in accordance with claim 7 wherein said varactor diode is electrically connected in parallel with said first capacitor and said fourth capacitor is electrically connected in parallel with said second capacitor, said apparatus additionally comprising:

a first oscillator, wherein said second capacitor in parallel with said fourth capacitor forms a capacitance element of said first oscillator;

a second oscillator, wherein said first capacitor in parallel with said varactor diode forms a capacitance element of said second oscillator;

means for combining the output signal from said first oscillator and the output signal from said second oscillator to establish a difference frequency signal, wherein the voltage applied to the anode of said varactor diode is manipulated until said difference frequency is about 10 KHz when the same fluid is present in said reference cell and said sample cell so as to substantially match the capacitance of said reference cell and said sample cell as seen by said first oscillator and said second oscillator when the same fluid is in said reference cell and said sample cell; and means for converting said difference frequency signal to a DC voltage, said DC voltage being representative of the concentration of said component of said sample passing through said sample cell.

9. Apparatus in accordance with claim 7 wherein said varactor diode is electrically connected in parallel with said second capacitor and said fourth capacitor is electrically connected in parallel with said first capacitor, said apparatus additionally comprising:

a first oscillator, wherein said second capacitor in parallel with said varactor diode forms a capacitance element of said first oscillator;

a second oscillator, wherein said first capacitor in parallel with said fourth capacitor forms a capacitance element of said second oscillator;

means for combining the output signal from said first oscillator and the output signal from said second oscillator to establish a difference frequency signal, wherein the voltage applied to the anode of said varactor diode is manipulated until said difference frequency is about 10 KHz when the same fluid is present in said reference cell and said sample cell so as to substantially match the capacitance of said reference cell and said sample cell as seen by said first oscillator and said second oscillator when the same fluid is in said reference cell and said sample cell; and means for converting said difference frequency signal to a DC voltage, said DC voltage being representative of the concentration of said component of said sample passing through said sample cell.

10. Apparatus in accordance with claim 6 additionally comprising a chromatographic oven, wherein said dielectric constant detector is located inside of said chromatographic oven and said means for varying the magnitude of the voltage supplied to said varactor diode is located outside of said chromatographic oven.

11. A method for substantially matching the capacitance of a reference cell and sample cell contained in a dielectric constant detector when the same fluid is present in said reference cell and said sample cell comprising the step of varying the magnitude of the voltage supplied to the anode of a varactor diode, wherein said reference cell has first and second plates which form a first capacitor and wherein said sample cell has first and second plates which form a second capacitor, wherein the cathode of said varactor diode is electrically connected to said first plate of one of said first capacitor and said second capacitor, and wherein the anode of said varactor diode is electrically connected to ground for RF frequencies through a third capacitor having a capacitance substantially larger than the capacitance which can be provided by said varactor diode.

12. A method in accordance with claim 11 wherein a fourth capacitor is electrically connected in parallel to the one of said first capacitor or said second capacitor to which said varactor diode is not electrically connected and wherein said fourth capacitor has a capacitance substantially equal to the average capacitance added by said varactor diode to the one of said first capacitor or said second capacitor to which said varactor diode is electrically connected in parallel.

13. A method in accordance with claim 12 wherein said varactor diode is electrically connected in parallel with said first capacitor and said fourth capacitor is electrically connected in parallel with said second capacitor, said method additionally comprising the steps of:

generating a first output signal having a frequency which is a function of the capacitance of said second capacitor in parallel with said fourth capacitor;

generating a second output signal which has a frequency which is a function of the capacitance of said first capacitor in parallel with said varactor diode;

combining said first output signal and said second output signal to establish a difference frequency signal, wherein the voltage applied to the anode of said varactor diode is manipulated until the frequency of said difference frequency signal is about 10 KHz when the same fluid is present in said reference cell and said sample cell so as to substantially match the capacitance of said reference cell and said sample cell as seen by the circuitry utilized to generate said first output signal and said second output signal.

14. A method in accordance with claim 12 wherein said varactor diode is electrically connected in parallel with said second capacitor and said fourth capacitor is electrically connected in parallel with said first capacitor, said method additionally comprising the steps of:

generating a first output signal having a frequency which is a function of the capacitance of said first capacitor in parallel with said fourth capacitor;

generating a second output signal which has a frequency which is a function of the capacitance of said second capacitor in parallel with said varactor diode;

combining said first output signal and said second output signal to establish a difference frequency signal, wherein the voltage applied to the anode of said varactor diode is manipulated until the frequency of said difference frequency signal is about 10 KHz when the same fluid is present in said reference cell and said sample cell so as to substantially match the capacitance of said reference cell and said sample cell as seen by the circuitry utilized to generate said first output signal and said second output signal.

15. A method in accordance with claim 11 wherein said dielectric constant detector is located inside a chromatographic oven and the means used to vary the magnitude of the voltage supplied to said varactor diode is located outside said chromatographic oven.

16. A method for obtaining an analysis of the concentration of a component of a material comprising the steps of:

passing a stream of a carrier fluid to a chromatographic separation column;

passing the stream of said carrier fluid from said chromatographic separation column through the sample cell of a dielectric constant detector;

passing a stream of said carrier fluid through the reference cell of said dielectric constant detector, wherein said reference cell has first and second plates which form a first capacitor and wherein said sample cell has first and second plates which form a second capacitor;

varying the magnitude of the voltage supplied to the anode of a varactor diode in such a manner that the capacitance of said sample cell is substantially matched to the capacitance of said reference cell when only said carrier fluid is flowing through both said reference cell and said sample cell, wherein the cathode of said varactor diode is electrically connected to said first plate of one of said first capacitor and said second capacitor and wherein the anode of said varactor diode is electrically connected to ground for RF frequencies through a third capacitor having a capacitance substantially larger than the capacitance which can be provided by said varactor diode;

injecting a sample of said material into said stream of said carrier fluid flowing to said chromatographic separation column, wherein said carrier fluid containing separated components of the sample of said material flows from said chromatographic separation column through said sample cell and wherein the difference between the capacitance of said sample cell and the capacitance of said reference cell is representative of the concentration of a component of said sample passing through said sample cell.

17. A method in accordance with claim 16 wherein a fourth capacitor is electrically connected in parallel to the one of said first capacitor or said second capacitor to which said varactor diode is not electrically connected and wherein said fourth capacitor has a capacitance substantially equal to the average capacitance added by said varactor diode to the one of said first capacitor or said second capacitor to which said varactor diode is electrically connected in parallel.

18. A method in accordance with claim 17 wherein said varactor diode is electrically connected in parallel with said first capacitor and said fourth capacitor is electrically connected in parallel with said second capacitor, said method additionally comprising the steps of:

generating a first output signal having a frequency which is a function of the capacitance of said second capacitor in parallel with said fourth capacitor;

generating a second output signal which has a frequency which is a function of the capacitance of said first capacitor in parallel with said varactor diode;

combining said first output signal and said second output signal to establish a difference frequency signal, wherein the voltage applied to the anode of said varactor diode is manipulated until the frequency of said difference frequency signal is about 10 KHz when the same fluid is present in said reference cell and said sample cell so as to substantially match the capacitance of said reference cell and said sample cell as seen by the circuitry utilized to generate said first output signal and said second output signal.

19. A method in accordance with claim 17 wherein said varactor diode is electrically connected in parallel with said second capacitor and said fourth capacitor is electrically connected in parallel with said first capacitor, said method additionally comprising the steps of:

generating a first output signal having a frequency which is a function of the capacitance of said first capacitor in parallel with said fourth capacitor;

generating a second output signal which has a frequency which is a function of the capacitance of said second capacitor in parallel with said varactor diode;

combining said first output signal and said second output signal to establish a difference frequency signal, wherein the voltage applied to the anode of said varactor diode is manipulated until the frequency of said difference frequency signal is about 10 KHz when the same fluid is present in said reference cell and said sample cell so as to substantially match the capacitance of said reference cell and said sample cell as seen by the circuitry utilized to generate said first output signal and said second output signal.

20. A method in accordance with claim 16 wherein said dielectric constant detector is located inside a chromatographic oven and the means used to vary the magnitude of the voltage supplied to said varactor diode is located outside said chromatographic oven.

* * * * *

UNITED STATES PATENT AND TRADEMARK OFFICE
CERTIFICATE OF CORRECTION

PATENT NO. : 4,673,869

DATED : June 16, 1987

INVENTOR(S) : Richard W. Michael

It is certified that error appears in the above-identified patent and that said Letters Patent is hereby corrected as shown below:

Col. 7, line 50, delete "to" and insert therefor ---in---.
Col. 8, line 63, after "ground" insert ---through said third capacitor---.

Signed and Sealed this

Eighth Day of December, 1987

Attest:

DONALD J. QUIGG

Attesting Officer

Commissioner of Patents and Trademarks